United States Patent [19]

Lakin

[11] Patent Number: 5,894,647
[45] Date of Patent: Apr. 20, 1999

[54] METHOD FOR FABRICATING PIEZOELECTRIC RESONATORS AND PRODUCT

[75] Inventor: Kenneth Meade Lakin, Redmond, Oreg.

[73] Assignee: TFR Technologies, Inc., Bend, Oreg.

[21] Appl. No.: 08/885,270

[22] Filed: Jun. 30, 1997

[51] Int. Cl.⁶ .................................................. H04R 17/00
[52] U.S. Cl. .................................... 29/25.35; 310/9.5
[58] Field of Search ........................... 29/25.35; 310/9.5

[56] References Cited

U.S. PATENT DOCUMENTS 3,760,471   9/1973   Borner ................................. 29/25.35

*Primary Examiner*—Timothy V. Eley
*Assistant Examiner*—Benjamin M. Halpern
*Attorney, Agent, or Firm*—G. Joseph Buck

[57] ABSTRACT

A method for fabricating piezoelectric resonators on a substrate such that the resonant frequency of one resonator is shifted by a small amount from another of the resonators. By means of differential fabrication of the electrodes, the thickness of the metal in an electrode for one resonator is increased relative to that of another resonator to obtain the shift in resonant frequency. The frequency of a single resonator also may be adjusted to a specific frequency by the addition of a differential layer of metal to one of the electrodes comprising the resonator. Mask alignment errors in the differential fabrication process cause non-uniformities in the thickness of the metal in the electrode which non-uniformities significantly degrade the performance of the resonator. The areas of non-uniform thickness of electrode that degrade the performance are removed in this process.

10 Claims, 2 Drawing Sheets

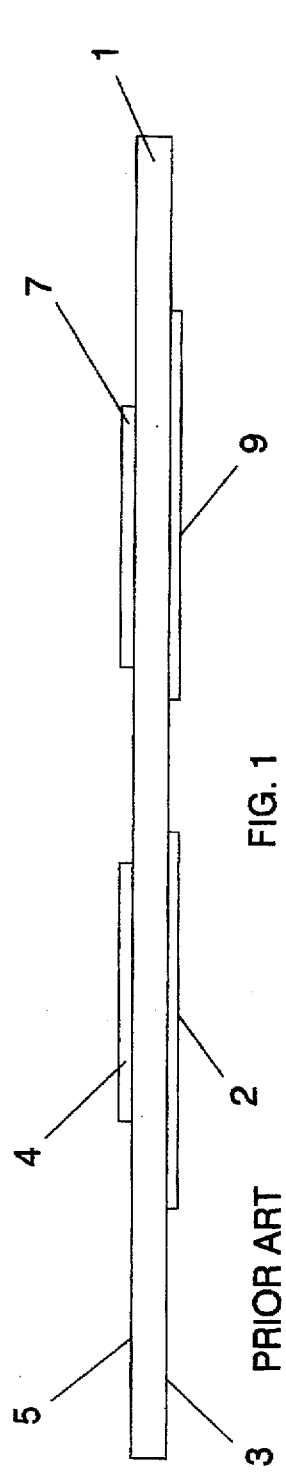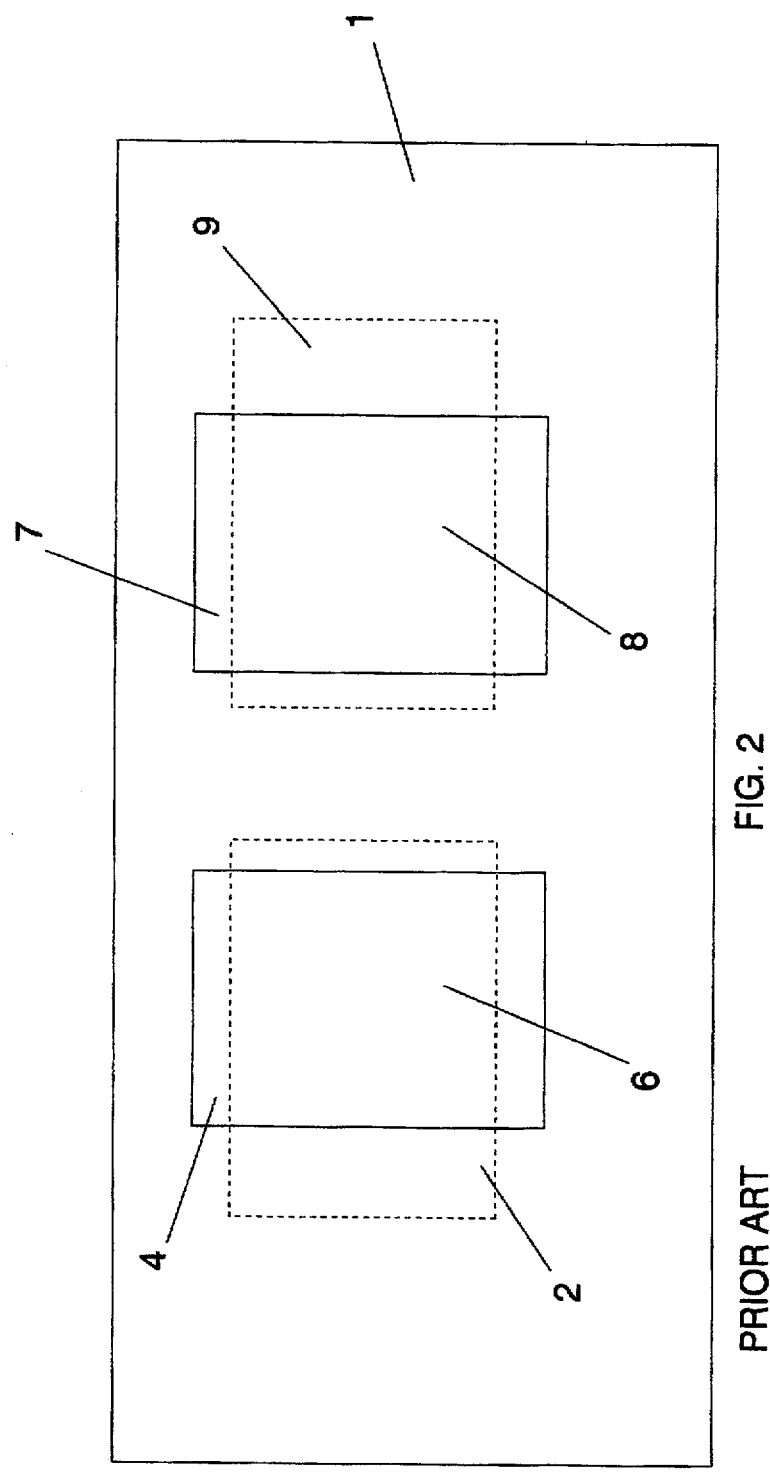

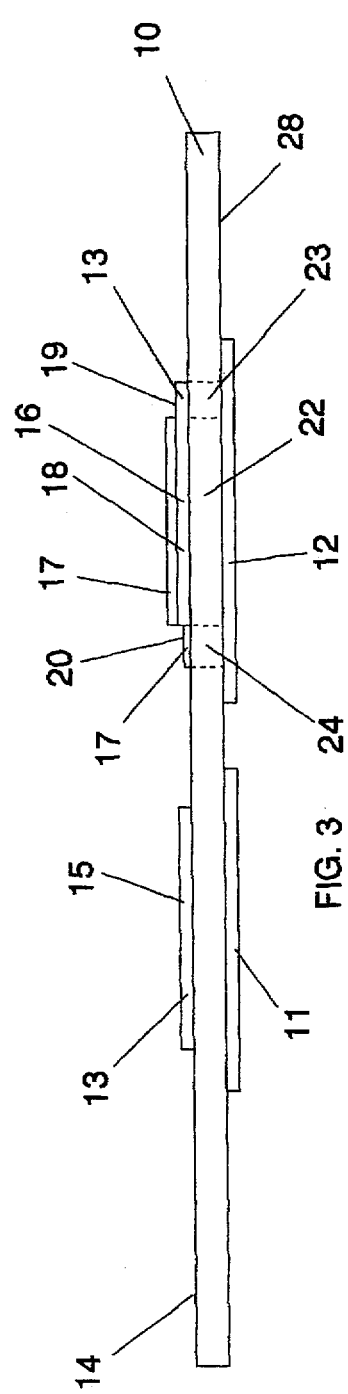
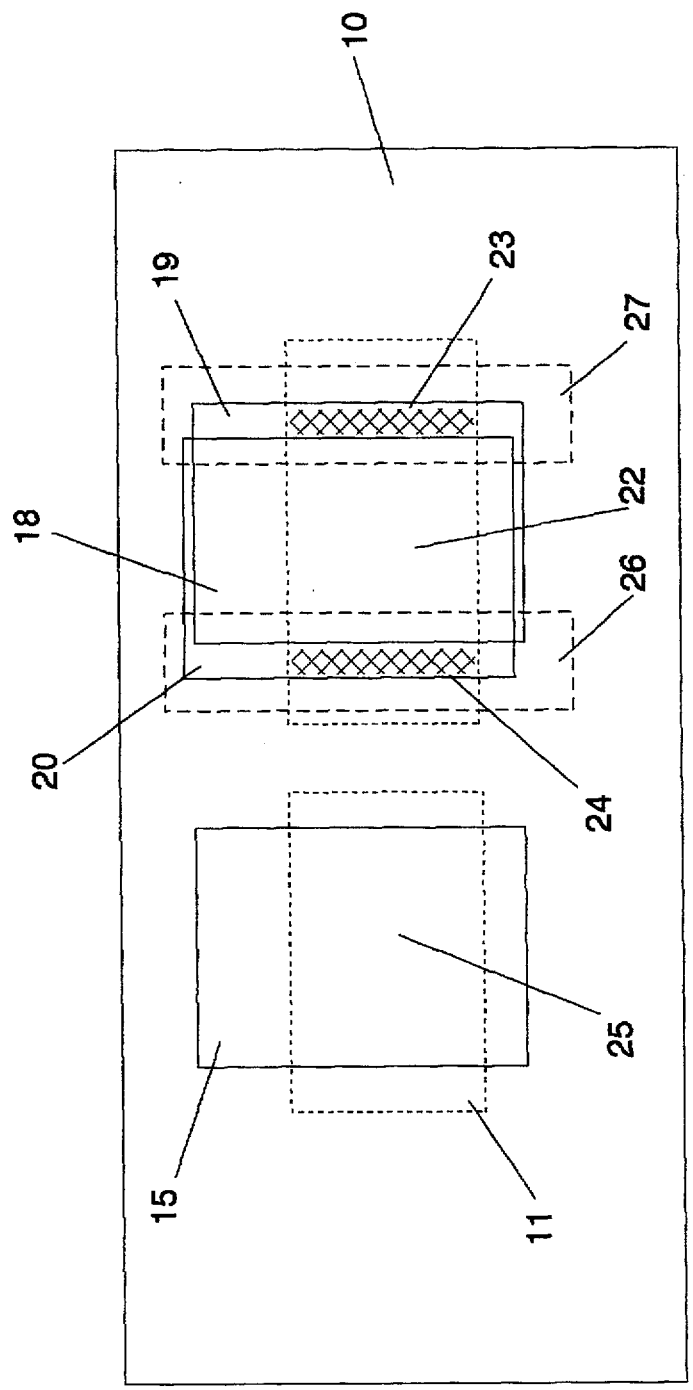

METHOD FOR FABRICATING PIEZOELECTRIC RESONATORS AND PRODUCT

1. BACKGROUND OF THE INVENTION a. Field of the Invention

This invention pertains to the fabrication of piezoelectric resonators which resonate at microwave frequencies. More particularly this invention pertains to the fabrication of multiple resonators on a single piezoelectric substrate, where the resonant frequency of one resonator is shifted by a small amount relative to the resonant frequency of one or more of the other resonators on the same substrate.

b. Description of the Prior Art

In the prior art, piezoelectric resonators, or "crystals" for use at high frequencies, e.g. 2 to 30 mhz, have been fabricated from thin slabs of quartz crystal. A conducting electrode is placed on the top surface of the slab and a second conducting electrode is placed on the bottom surface of the slab. Because the application of an electric field between the two electrodes causes the thin slab of piezoelectric material to deform mechanically, and because the periodic deformation of the thin slab of piezoelectric material exhibits a mechanical resonance, the attached pair of electrodes exhibit a similar electrical resonance.

The resonant frequency of the device may be raised by using an abrasive in a grinding or lapping process to reduce the thickness of the piezoelectric slab and thus raise the frequency of its mechanical resonance. However, at microwave frequencies, the piezoelectric slab is too thin to withstand grinding or lapping and often breaks. Furthermore, if the thin slab is supported by additional structure at its periphery, e.g. an inverted mesa structure, even if the thin slab does not break, the grinding or lapping pressure bends the slab and produces a slab having a non-uniform thickness, which non-uniformity substantially degrades the operation of the resonator.

In order to obtain a thin piezoelectric substrate having a uniform thickness, a thin substrate has been fabricated using etching processes or deposition processes using sputtering or evaporation techniques. Metal electrodes are then placed on the surfaces of the substrate using similar processes. See "High-Q Microwave Acoustic Resonators and Filters," by Lakin, Kline and McCarron, IEEE Trans. on Microwave Theory and Techniques, Vol. 41, No. 12, December 1993, p. 2139. Various methods have been used to fabricate such devices for use at microwave frequencies, see e.g. Guttwein, Ballato and Lukaszek, U.S. Pat. No. 3,694,677. The substrate may consist entirely of a piezoelectric material, or may consist of layers of piezoelectric and non-piezoelectric materials. See e.g. "Acoustic Bulk Wave Composite Resonators", Applied Physics Letters 38(3) by Lakin and Wang, Feb. 1, 1981.

Many techniques exist for fabricating piezoelectric resonators. For some applications a suitable resonator can be fabricated simply by adding conducting electrodes to a thin piezoelectric crystal "blank" obtained from commercial sources which "blank" may have been further thinned by processing. Another technique is to first fabricate a bottom electrode on a supporting substrate such as silicon. Next, a thin film of piezoelectric material is deposited over the electrode and substrate. The supporting substrate is then removed in some regions so as to expose the bottom electrode, which leaves the electrode and piezoelectric film in the form of a membrane or plate supported at the edges. The top electrode is then fabricated on the top surface of the membrane. The equivalent of a thin membrane may also be created by fabricating a sequence of quarter-wavelength thick layers of material upon a suitable substrate. A bottom electrode is then fabricated upon the uppermost quarter-wavelength reflector followed by a layer of piezoelectric material and finally by the top electrode. The quarter-wavelength thick layers of material act as reflectors and mechanically isolate the acoustic motion of the bottom electrode and of the piezoelectric material from the underlying substrate.

Curran et al., U.S. Pat. No. 3,222,622, have disclosed the fabrication of a plurality of resonators located upon a single substrate and electrically interconnected so as to provide complex filtering properties. Curran, et al. also disclose using different thicknesses for the metal electrodes on the different, resonators so as to obtain slightly different resonant frequencies for such resonators located upon a single substrate. Black et al., in U.S. Pat. No. 4,320,365 discloses various means for fabricating thin substrates that include a piezoelectric layer for use in making resonators. Black et al. disclose that the placement of acoustic absorbing material at the periphery of the electrodes and the removal of zinc oxide at the periphery of the electrodes may serve to enhance the resonance "Q" factor, reduce unwanted sidelobe response, and/or improve filter efficiency.

Roberts et al., U.S. Pat. No. 4,833,430, discloses the use of small coupling adjust spots to alter the resonant properties of coupled resonators located upon a single substrate. Roberts et al. also encountered some problems arising from errors in the alignment of successive masks used in the metal deposition process and they adjusted the thickness of the deposited metal to compensate for some of the consequences of the alignment errors.

As indicated above, it is known in the prior art (e.g. U.S. Pat. No. 4,320,365) that two resonators may be fabricated, upon a single substrate and that the two resonators can be made to have different resonant frequencies by fabricating the metal electrodes so that one of the electrodes forming one resonator has a thickness that differs from the corresponding electrode for the other resonator. It is also known in the prior art that one can. fabricate such electrodes having differing thicknesses by depositing each electrode in a separate step in the fabrication process. For example, referring to FIGS. 1 and 2, substrate 1, which may consist solely of a piezoelectric material or of layers of piezoelectric and non-piezoelectric materials, may be fabricated by any of the methods known in the prior art. Then by suitable masking operations, conducting electrodes 2 and 9 are placed by deposition, sputtering, or other means upon bottom surface 3 of the substrate. By means of suitable masking operations, conducting electrode 4 is deposited upon top surface 5 of the substrate. The area of electrode 4 that overlaps with the area of electrode 2 defines the physical location and extent of resonator 6. By suitable masking operations, electrode 7 is then placed upon top surface 5 of the substrate and the area of electrode 7 that overlaps with electrode 9 similarly defines resonator 8. Electrode 7 can be fabricated to have a thickness that is greater than the thickness of electrode 4 simply by increasing the length of time of the deposition or sputtering process that is used to fabricate electrode 7 as compared with the length of time used for the fabrication of electrode 4.

However, the practical problem with fabricating electrodes 4 and 7 in two completely separate steps is that it is very difficult to control accurately each of the two separate deposition or sputtering processes so as to obtain a thickness for electrode 7 that is greater than that of electrode 4 by only a small, controlled amount so as to obtain two resonators whose resonant frequencies differ from each other by only a small and controlled amount. For example for a resonant frequency of 1900 mhz., the resonators may comprise a piezoelectric film having a thickness of 1 micron and electrodes having a thickness of only 1000 angstroms (0.1 microns). An increase in the metal thickness of one electrode by 76 microns would reduce the resonant frequency by approximately 38 mhz. Accordingly, the amount of additional metal deposited would have to be controlled to an accuracy of 7.6 microns if one wished to obtain the specified frequency shift with an accuracy of 10 percent.

A similar problem arises in the fabrication of a resonator having its resonance at a particular specified frequency with high accuracy. It is difficult to control the thicknesses of the substrate and of the metal electrodes with enough accuracy to obtain the desired result.

2. SUMMARY OF THE INVENTION

Instead of fabricating electrodes 4 and 7 in two separate steps, the present invention fabricates both electrodes 4 and 7 at one time in one deposition or sputtering process and then, in a separate step, increases the metal thickness of electrode 7 by a small, incremental amount, by depositing or sputtering an additional thin layer of metal only upon electrode 7. This process is referred to herein as the differential fabrication technique. In this way, the difference in the thicknesses can be controlled much more accurately. However, initial attempts at using the differential fabrication technique to fabricate two or more resonators having resonances at microwave frequencies that differ by a small, controlled amount often produced resonators having relatively low Q's and unpredictable frequency responses.

Similarly, a single resonator having a resonance at a specific frequency is fabricated by first fabricating a resonator having its resonant frequency slightly higher than the desired frequency. One then measures the initial resonant frequency of the resonator and then adjusts the initial resonant frequency by the addition of a differential layer of metal to one of the electrodes of the resonator so as to obtain the desired resonant frequency. Because attaching electrical connections to the device for the measurement of its resonant frequency may degrade the device, the initial resonant frequency typically would be measured indirectly by performing the measurement upon a similar resonator located nearby on the same substrate.

The present invention is based upon the recognition that, in the fabrication process, the area of the substrate upon which the differential layer of metal for an electrode is deposited often will not coincide exactly with the area occupied by the metal deposited in the initial formation of the electrode. Because of practical limitations upon the accuracy with which a subsequent masking process can be aligned with a previous masking process, the differential layer of metal that is added to the initial layer of metal that forms the electrode will be slightly misaligned. As a consequence of the misalignment, the composite electrode will have narrow strips along its edges in which the metal thickness will be only that of the originally deposited layer of metal, or only that of the differential layer of metal. Although the electrodes of this invention are described as being made of metal, the word "metal" should be understood to encompass any suitable electrically conducting material.

The present invention also is based upon the realization that when the widths of the strips of thinner metal in the electrodes is comparable to or greater than the thickness of the substrate upon which the opposing electrodes are deposited, these thin strips, in effect, form additional "parasitic" resonators having resonant frequencies that, because of the different metal thicknesses comprising these parasitic resonators, are offset from the resonant frequency of the primary resonator. The resonator defined by the area of overlap with the bottom electrode of that portion of the top electrode having a uniform metal thickness equal to the combination of the metal deposited in the initial process and the additional differential layer of metal deposited in the subsequent "differential" deposition is referred to herein as the "primary resonator". These parasitic resonators are electrically connected in parallel with the primary resonator.

Theoretical calculations have revealed that the parasitic resonators can substantially degrade and distort the characteristics of the primary resonator. For example, a parasitic resonator having a lateral area of as little as one five-hundredth of the area of the primary resonator can cut in half the parallel resonant Q of the primary resonator if the series resonant frequency of the parasitic resonator is close to the parallel resonant frequency of the primary resonator. A typical electrode for a resonator operating at 1900 mhz. may have lateral dimensions of 200 microns by 200 microns. As a consequence an alignment error of as little as 0.5 microns can substantially degrade the performance of such a resonator.

Accordingly the present invention includes an additional step in the fabrication process, which additional step removes narrow strips along the edges of the electrode that was fabricated by the differential process so as to remove the areas from the electrode in which the metal thickness differs from the uniform thickness of metal in the primary resonator. The removal of the narrow strips thus removes from the device the parasitic resonators that degrade its performance.

3. BRIEF DESCRIPTION OF THE DRAWINGS

FIG. 1 is a side view and

FIG. 2 is a top view of electrodes on a substrate that comprise resonators of the prior art.

FIG. 3 is a side view and

FIG. 4 is a top view of an embodiment of the resonators that comprise the present invention.

4. DETAILED DESCRIPTION

Referring to FIGS. 3 and 4, to fabricate a device having two resonators in accord with this invention, a thin substrate 10 is fabricated by any of the various methods known in the prior art. See e.g. "Acoustic Bulk Wave Composite Resonators", by Lakin and Wang, Appl. Phys. Lett. 38 (3) Feb. 1, 1981. Although such fabrication techniques typically include a supporting structure for the substrate that is located outside of the region occupied by the resonators, for simplicity FIGS. 3 and 4 do not depict additional supporting structure.

For simplicity of explanation and description, the invention is described in terms of a simple substrate having metal electrodes located upon its bottom and to surfaces. However, it should be understood that substrate 10 need not consist solely of piezoelectric material but may consist of one or more piezoelectric layers in combination with one or more other layers of material. It should also be understood that configurations that include additional layers of substrate superimposed upon either or both of the electrodes may be utilized in the practice of this invention.

Referring again to FIGS. 3 and 4, in the preferred embodiment, electrodes 11 and 12 are fabricated at the same time on the bottom surface 28 of the substrate using any of the techniques known in the prior art, e.g. by deposition of the desired pattern of electrodes using a mask and evaporation or sputtering, or using in mask and photo-resist material together with evaporation or sputtering and then "lifting-off" the undesired areas of conductor to leave the desired electrode pattern, or depositing a layer of conducting material on the surface of the substrate and then using a mask and etching to remove portions of the conducting material so as to leave the desired pattern of electrodes. Because electrodes 11 and 12 are fabricated at the same time, electrodes 11 and 12 can be fabricated so as to have nearly the same thicknesses. By similar means a primary layer 13 of metal is fabricated on the top surface 14 of the substrate to form electrodes 15 and 16 at the same time. The primary layer 13 of metal that forms electrodes 15 and 16 is fabricated by deposition or other means in a single operation so that the thickness of the primary layer in electrode 15 is consequently very nearly the same as the thickness of the primary layer in electrode 16. In the differential fabrication technique, a very thin additional differential layer 17 of metal is added by sputtering, evaporation or other technique only to electrode 16 The area of electrode 15 that overlaps with electrode 11 defines resonator 25. The area of electrode 16 having a metal thickness equal to the sum of primary layer 13 and differential layer 17 and that overlaps with electrode 12 defines resonator 22. The term "overlap" is intended to refer to that area of an electrode lying on one side of the substrate that, when projected through the substrate in a direction normal to the surface of the substrate, coincides with with the electrode located on the opposing surface of the substrate.

Because of the very small dimensions of the devices that are fabricated for use at microwave frequencies, the differential fabrication technique used for these devices carries with it the practical problem that the mask that is used for the fabrication of the primary layer 13 of metal is typically not aligned exactly with the mask that is used for the fabrication of the differential layer 17 of metal for the electrode. As a consequence, electrode 16 will consist not only of an area 18 of metal having a thickness equal to the sum of the thickness of the primary layer 13 and of the differential layer 17, but will also have a thin strip 19 or strips located along an edge or edges of electrode in which the conductor thickness is that of the primary layer alone and may have a thin strip 20 or strips located along and edge or edges of the electrode in which the thickness of the conducting material is that of the differential layer 17 alone. To the extent that strip 19 overlaps with bottom electrode 12, strip 19 defines a parasitic resonator 23 (shown as cross-hatched in FIG. 4) and to the extent that strip 20 overlaps with bottom electrode 11, strip 20 defines a parasitic resonator 24 (also shown as cross-hatched in FIG. 4).

This invention recognizes that even though the physical size of resonators 23 and 24 may be very small relative to the size of primary resonator 22, each of these resonators can substantially degrade the operation of resonator 22. To the fabrication process, this invention adds the step of removing from electrode 16 the strips of metal from electrode 16 that define the parasitic resonators. The strips may be removed from by using a mask that protects most of the area of electrode 16 but that allows the removal of the strips of the metal along the edges at which the electrode thickness differs from that of resonator 22 and that create the parasitic resonators. Such a mask would, for example, expose the areas encompassed by the areas 26 and 27 (enclosed by dashed lines in FIG. 4), so that the metal in strips 19 and 20 that lie within areas 26 and 27 can be removed by etching or other appropriate process. In anticipation of the removal of the strips, the primary and differential layers of metal that comprise electrode 16 are fabricated so as to be somewhat larger than the desired size of electrode 16 that will remain after the removal of the narrow strips. Because a slight shift in the physical location of electrode 16 upon the substrate does not affect the performance of resonator 22, a modest error in the alignment of the mask that is used for the removal of strips 19 and 20 does not degrade the performance of resonator 22 so long as the alignment is sufficiently accurate so as to include strips 19 and 20 within those areas of electrode 16 that are removed.

It should be understood that the non-uniform thicknesses of metal need only be removed from those areas where the non-uniform thickness of metal overlaps with electrode 12 because it, is only these areas that create the parasitic resonators.

Although, in the preferred embodiment, the differential layer 17 of metal is added to electrode 16 on top of the primary layer 13 of metal in electrode 16, it should be understood that the sequence could be reversed in that the differential layer 17 of metal in electrode 16 could first be deposited upon the substrate and then the primary layer 13 of metal in both electrodes 15 and 16 could then be deposited in one operation.

It should be understood that the differential fabrication technique could, be applied to electrode 12 instead of to electrode 16. In the latter instance, a differential layer of metal would, instead, be added to that portion of electrode 12 that overlaps with electrode 16, either before or after the primary layer of metal for electrode 12 is fabricated on the substrate. In this latter instance, the areas of electrode 12 that coincided with electrode 16 and in which the metal thickness was not equal to the sum of the primary layer of metal and the differential layer of metal, would then be removed in a manner similar to that described above for the removal of such non-uniform areas of electrode 16.

It should also be understood that if electrodes 15 and 16 are fabricated by depositing a layer of metal on a general area of surface 14 of substrate 10, either preceded by or followed by the depositing of a differential layer of metal in the general area to be occupied by electrode 16, which depositions are then followed by a masking and etching process that removes the deposited metal from the surface except for the specific areas occupied by electrodes 15 and 16, then the step of this invention in which the areas 23 and 24 are removed, is, in effect, included as part of the etching process that removes metal from the surface of the substrate so as to leave the desired electrodes 15 and 16.

Although the process of this invention has been described above in connection with the fabrication of two resonators in which the resonant frequency of one resonator is shifted relative to the resonant frequency of the other resonator by the addition of a differential layer of material to one resonator, the same process of this invention may be utilized for the fabrication of a single resonator when the resonant frequency of the single resonator is adjusted by the addition of a differential layer of material. For example, referring to FIGS. 3 and 4, resonator 22 may be fabricated as indicated above and the differential layer 17 then added shift to resonant frequency of resonator 22 to a specific desired frequency. Strips 19 and 20 would then be removed by the subsequent removal of the metal within areas 26 and 27.

I claim:

1. A method for fabricating a piezoelectric resonator having a specified resonant frequency, the method comprising:

fabricating a substrate having a top and bottom surface and having a top electrode on the top surface of the substrate and having a bottom electrode on the bottom surface of the substrate, the substrate including a layer of piezoelectric material, the top electrode comprising a primary layer of conducting material, a portion of the top electrode overlapping with a portion of the bottom electrode and said overlapping portions defining the resonator, adding a differential layer of conducting material on top of the top electrode, said differential layer of conducting material shifting the resonant frequency of the resonator to approximately the specified resonant frequency, removing from the top electrode portions of the top electrode that include, but are not necessarily limited to, those portions of the top electrode that overlap with a portion of the bottom electrode and that are not composed of a portion of both the primary layer of conducting material and the differential layer of conducting material.

2. A method for fabricating first and second piezoelectric resonators, the resonant frequency of the first resonator being shifted in frequency relative to the resonant frequency of the second resonator, the method comprising:

fabricating a substrate having a top and bottom surface and having first and second top electrodes on the top surface of the substrate and having first and second bottom electrodes on the bottom surface of the substrate, the substrate including a layer of piezoelectric material, the first and second top electrodes comprising a primary layer of conducting material, and the first and second bottom electrodes comprising a primary layer of conducting material and the first top electrode additionally comprising a differential layer of conducting material, a portion of the first top electrode overlapping with a portion of the first bottom electrode and said overlapping portions defining the first resonator, a portion of the second top electrode overlapping with a portion of the second bottom electrode and said overlapping portions defining the second resonator, said differential layer of conducting material of said first top electrode shifting the resonant frequency of the first resonator relative to the resonant frequency of the second resonator, removing from the first top electrode those portions of the first electrode that overlap with the first bottom electrode and that are not composed of a portion of both the layer of conducting material and the differential layer of conducting material.

3. The method of claim 2 wherein the step of fabricating a substrate having a top and bottom surface and having first and second top electrodes on the top surface of the substrate and having first and second bottom electrodes on the bottom surface of the substrate includes the steps of:

fabricating a primary layer of conducting material on the top surface of the substrate to form first and second top electrodes on the top surface of the substrate, and fabricating a differential layer of conducting material upon the first top electrode so as to shift the resonant frequency of the first resonator relative to the resonant frequency of the second resonator.

4. The method of claim 2 wherein the step of fabricating a substrate having a top and bottom surface and having first and second top electrodes on the top surface of the substrate and having first and second bottom electrodes on the bottom surface of the substrate includes the steps of:

fabricating a differential layer of conducting material on the top surface of the substrate, and fabricating a primary layer of conducting material on the top surface of the substrate to form first and second top electrodes on the top surface of the substrate, said differential layer of conducting material on the top surface of the substrate underlying the primary layer of conducting material of the first top electrode.

5. A piezoelectric resonator having specified resonant frequency fabricated by:

fabricating a substrate having a top and bottom surface and having a top electrode on the top surface of the substrate and having a bottom electrode on the bottom surface of the substrate, the substrate including a layer of piezoelectric material, the top electrode comprising a primary layer of conducting material, a portion of the top electrode overlapping with a portion of the bottom electrode and said overlapping portions defining the resonator, adding a differential layer of conducting material on top of the top electrode, said differential layer of conducting material shifting the resonant frequency of the resonator to approximately the specified resonant frequency, removing from the top electrode those portions of the top electrode that overlap with a portion of the bottom electrode and that are not composed of a portion of both the primary layer of conducting material and the differential layer of conducting material whereby the remaining portion of the top electrode that overlaps with a portion of the bottom electrode has a substantially uniform thickness.

6. A device comprising first and second piezoelectric resonators, the resonant frequency of the first resonator being shifted in frequency relative to the resonant frequency of the second resonator, fabricated by:

fabricating a substrate having a top and bottom surface and having first and second top electrodes on the top surface of the substrate and having first and second bottom electrodes on the bottom surface of the substrate, the substrate including a layer of piezoelectric material, the first and second electrodes comprising a primary layer of conducting material, and the first and second bottom electrodes comprising a primary layer of conducting material and the first top electrode additionally comprising a differential layer of conducting material, a portion of the first top electrode overlapping with a portion of the first bottom electrode and said overlapping portions defining the first resonator, a portion of the second top electrode overlapping with a portion of the second bottom electrode and said overlapping portions defining the second resonator, said differential layer of conducting material of said first top electrode shifting the resonant frequency of the first resonator relative to the resonant frequency of the second resonator, removing from the first top electrode those portions of the first electrode that overlap with the first bottom electrode and that are not composed of a portion of both the layer of conducting material and the differential layer of conducting material whereby the remaining portion of the first top electrode that overlaps with the first bottom electrode has a substantially uniform thickness.

7. The device of claim 6 wherein the step of fabricating first and second top electrodes on the top surface of the substrate includes the steps of:

fabricating a primary layer of conducting material on the top surface of the substrate to form first and second top electrodes on the top surface of the substrate, and fabricating a differential layer of conducting material upon the first top electrode so as to shift the resonant frequency of the first resonator relative to the resonant frequency of the second resonator.

8. The device of claim 6 wherein the step of fabricating first and second top electrodes on the top surface of the substrate includes the steps of:

fabricating a differential layer of conducting material on the top surface of the substrate, and fabricating a primary layer of conducting material on the top surface of the substrate to form first and second top electrodes on the top surface of the substrate, said differential layer of conducting material on the top surface of the substrate underlying the primary layer of conducting material of the first top electrode.

9. The method of claim 1 in which the specified resonant frequency to which the resonant frequency of the resonator is shifted is specified as a specified shift in resonant frequency of the resonator relative to the resonant frequency of a second resonator fabricated as part of the same process set forth in claim 1.

10. The piezoelectric resonator of claim 5 in which the specified resonant frequency of the resonator is specified as a specified shift in resonant frequency of the resonator relative to the resonant frequency of a second resonator fabricated as part of the same process set forth in claim 5.

* * * * *